(12) United States Patent
Oishi (10) Patent No.: US 10,771,035 B2
(45) Date of Patent: Sep. 8, 2020

(54) MULTILAYER LC FILTER

(71) Applicant: Murata Manufacturing Co., Ltd., Nagaokakyo-shi, Kyoto-fu (JP)

(72) Inventor: Akihito Oishi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/368,908

(22) Filed: Mar. 29, 2019

(65) Prior Publication Data

US 2019/0229698 A1 Jul. 25, 2019

Related U.S. Application Data

(63) Continuation of application No. PCT/JP2017/033356, filed on Sep. 14, 2017.

(30) Foreign Application Priority Data

Oct. 5, 2016 (JP) .................................. 2016-197571

(51) Int. Cl.
*H03H 7/09* (2006.01)
*H03H 7/01* (2006.01)
*H01F 17/00* (2006.01)
*H03H 9/24* (2006.01)
*H03H 7/075* (2006.01)
*H01F 27/29* (2006.01)
*H03H 1/00* (2006.01)

(52) U.S. Cl.
CPC ........... *H03H 7/09* (2013.01); *H01F 17/0013* (2013.01); *H03H 7/0115* (2013.01); *H03H 7/0138* (2013.01); *H03H 7/075* (2013.01); *H03H 7/1775* (2013.01); *H03H 9/24* (2013.01); *H01F 27/292* (2013.01); *H01F 2017/0026* (2013.01); *H03H 2001/0085* (2013.01)

(58) Field of Classification Search
CPC ......... H03H 2001/0085; H03H 7/0115; H03H 7/09; H03H 7/1775; H03H 7/0138
USPC .................................................. 333/175, 185
See application file for complete search history.

(56) References Cited

U.S. PATENT DOCUMENTS

2007/0241839 A1 10/2007 Taniguchi
2012/0112856 A1 5/2012 Mizoguchi
(Continued)

FOREIGN PATENT DOCUMENTS

EP 2 009 787 A1 12/2008
JP 2012-023752 A 2/2012
(Continued)

OTHER PUBLICATIONS

Official Communication issued in International Patent Application No. PCT/JP2017/033356, dated Nov. 21, 2017.

*Primary Examiner* — Rakesh B Patel
(74) *Attorney, Agent, or Firm* — Keating & Bennett, LLP (57) ABSTRACT

A multilayer LC filter includes a magnetic coupling adjustment inductor for at least one LC resonator. The magnetic coupling adjustment inductor includes a line conductor pattern and a first via conductor connected to each other. The line conductor pattern is connected to an intermediate point of a second via conductor, and the first via conductor is connected to a ground conductor pattern. A loop inductor and the magnetic coupling adjustment inductor in the LC resonator for which the magnetic coupling adjustment inductor is provided are magnetically coupled to a loop inductor in another adjacent LC resonator.

6 Claims, 6 Drawing Sheets

(56) References Cited

U.S. PATENT DOCUMENTS

| | | |
|---|---|---|
| 2013/0241672 A1 | 9/2013 | Tamaru et al. |
| 2015/0061791 A1 | 3/2015 | Imamura |
| 2018/0013395 A1 | 1/2018 | Asada |

FOREIGN PATENT DOCUMENTS

| | | |
|---|---|---|
| JP | 2012-105026 A | 5/2012 |
| JP | 2015-046788 A | 3/2015 |
| WO | 2007/119356 A1 | 10/2007 |
| WO | 2012/066873 A1 | 5/2012 |
| WO | 2016/152211 A1 | 9/2016 |

MULTILAYER LC FILTER

CROSS REFERENCE TO RELATED APPLICATIONS

This application claims the benefit of priority to Japanese Patent Application No. 2016-197571 filed on Oct. 5, 2016 and is a Continuation Application of PCT Application No. PCT/JP2017/033356 filed on Sep. 14, 2017. The entire contents of each of these applications are hereby incorporated herein by reference.

BACKGROUND OF THE INVENTION

1. Field of the Invention

The present invention relates to a multilayer LC filter including a plurality of LC resonators in a multilayer body. More specifically, the present invention relates to a multilayer LC filter in which the strength of magnetic coupling between inductors in adjacent LC resonators is adjusted without increasing the size.

2. Description of the Related Art

Multilayer LC filters are used in various electronic devices. In each of the multilayer LC filters, LC resonators each including an inductor and a capacitor are formed in a multilayer body having multiple dielectric layers laminated therein.

Such a multilayer LC filter is disclosed in Japanese Unexamined Patent Application Publication No. 2012-23752.

Figure 6:
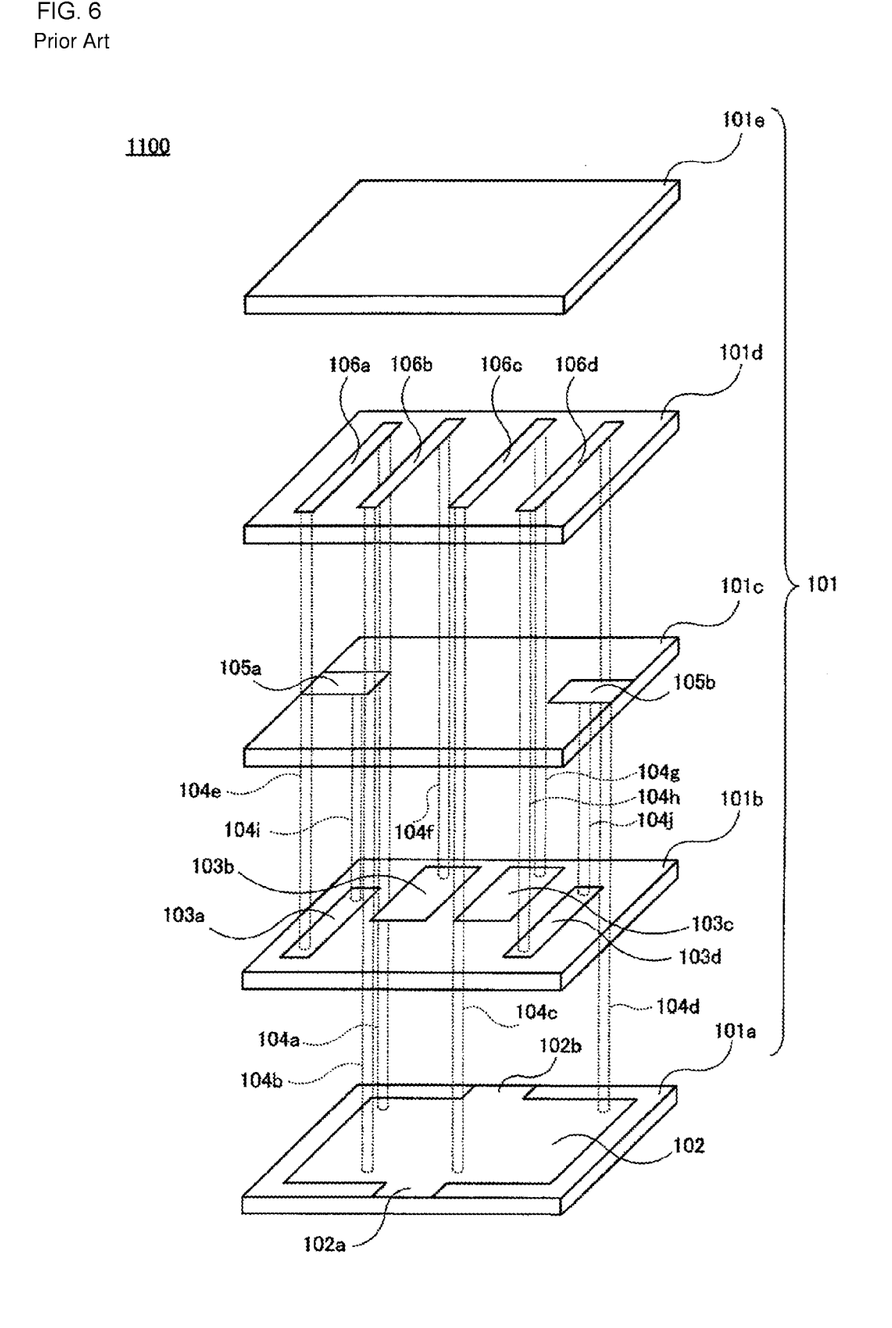
FIG. 6 is an exploded perspective view illustrating a multilayer LC filter 1100 disclosed in Japanese Unexamined Patent Application Publication No. 2012-23752.

FIG. 6 illustrates a multilayer LC filter (multilayer band pass filter) 1100 disclosed in Japanese Unexamined Patent Application Publication No. 2012-23752.

The multilayer LC filter 1100 includes a multilayer body 101 including five ceramic layers 101a to 101e laminated therein.

A ground conductor pattern (ground electrode) 102 is formed on an upper main surface of the ceramic layer (ground electrode formed layer) 101a. The ground conductor pattern 102 includes connecting conductor patterns 101a and 101b to connect to a ground terminal (earth terminal; not illustrated) formed on side surfaces of the multilayer body 101.

Four capacitor conductor patterns 103a to 103d are formed on an upper main surface of the ceramic layer (capacitor conductor pattern formed layer) 101b. In addition, four via conductors (via electrodes) 104a to 104d are formed through the ceramic layer 101b.

Connecting conductor patterns 105a and 105b for connection to input-output terminals (input-output electrodes; not illustrated) formed on opposing end surfaces of the multilayer body 101 are formed on an upper main surface of the ceramic layer (input-output electrode formed layer) 101c. In addition, six via conductors 104e to 104j are further formed through the ceramic layer 101b, in addition to the four via conductors 104a to 104d described above.

Four line conductor patterns (line electrodes) 106a to 106d are formed on an upper main surface of the ceramic layer (line conductor pattern formed layer) 101d. In addition, the via conductors 104a to 104h are formed through the ceramic layer 101d.

The ceramic layer 101e is a protective layer. No conductor pattern is formed on the ceramic layer and no via conductor is formed through the ceramic layer.

Four first to fourth LC resonators are formed in the multilayer body 101. Each LC resonator has a configuration in which a loop inductor and a capacitor are connected in parallel to each other.

The first LC resonator includes a loop inductor in which the via conductor 104e, the line conductor pattern 106a, and the via conductor 104a are connected to each other. In addition, the capacitor conductor pattern 103a and the ground conductor pattern 102 form a capacitor. As described above, the loop inductor and the capacitor are connected in parallel to each other.

Similarly, the second LC resonator includes a loop inductor in which the via conductor 104f, the line conductor pattern 106b, and the via conductor 104b are connected to each other and a capacitor which includes the capacitor conductor pattern 103b and the ground conductor pattern 102 and which is connected in parallel to the loop inductor. The third LC resonator includes a loop inductor in which the via conductor 104g, the line conductor pattern 106c, and the via conductor 104c are connected to each other and a capacitor which includes the capacitor conductor pattern 103c and the ground conductor pattern 102 and which is connected in parallel to the loop inductor. The fourth LC resonator includes a loop inductor in which the via conductor 104h, the line conductor pattern 106d, and the via conductor 104d are connected to each other and a capacitor which includes the capacitor conductor pattern 103d and the ground conductor pattern 102 and which is connected in parallel to the loop inductor.

The capacitor conductor pattern 103a of the first LC resonator is connected to one input-output terminal (not illustrated) with the via conductor 104i and the connecting conductor pattern 105a. Similarly, the capacitor conductor pattern 103d of the fourth LC resonator is connected to the other input-output terminal (not illustrated) with the via conductor 104j and the connecting conductor pattern 105b.

In the multilayer LC filter 1100, the loop inductor in the first LC resonator is magnetically coupled to the loop inductor in the second LC resonator, the loop inductor in the second LC resonator is magnetically coupled to the loop inductor in the third LC resonator, and the loop inductor in the third LC resonator is magnetically coupled to the loop inductor in the fourth LC resonator. The loop inductors that are magnetically coupled to each other are not limited to the loop inductors in adjacent LC resonators, and the loop inductors in the LC resonators that are spaced apart from each other are also magnetically coupled to each other. For example, the loop inductor in the first LC resonator is magnetically coupled not only to the loop inductor in the second LC resonator but also to the loop inductor in the third LC resonator and the loop inductor in the fourth LC resonator. However, the strength of the magnetic coupling is decreased with the increasing distance between the loop inductors.

The multilayer LC filter 1100 is capable of achieving desired frequency characteristics by adjusting the strength of the magnetic coupling between the loop inductors in adjacent LC resonators in the design stage of the product. The strength of the magnetic coupling between the loop inductors in adjacent LC resonators is capable of being adjusted through adjustment of the distance between the two loop inductors. For example, when the strength of the magnetic coupling between the two loop inductors is to be increased, it is only necessary to decrease the distance between the two loop inductors. In contrast, when the strength of the magnetic coupling between the two loop inductors is to be decreased, it is only necessary to increase the distance between the two loop inductors.

However, the method of adjusting the distance between the two loop inductors to adjust the strength of the magnetic coupling between the two loop inductors has a problem in that the multilayer body 101 is increased in size. In particular, when the strength of the magnetic coupling between the two loop inductors is to be decreased, it is necessary to increase the distance between the two loop inductors and the problem of the increase in size of the multilayer body 101 occurs. In addition, it is necessary to sufficiently increase the size of the multilayer body 101 so that the positions at which the loop inductors in the LC resonators are formed are capable of being shifted (adjusted) in this method and the problem of the increase in size of the multilayer body 101 occurs.

SUMMARY OF THE INVENTION

Preferred embodiments of the present invention provide multilayer LC filters each including a rectangular or substantially rectangular parallelepiped multilayer body including a plurality of dielectric layers laminated therein; a plurality of line conductor patterns provided between layers of the dielectric layers; a plurality of capacitor conductor patterns provided between layers of the dielectric layers; at least one ground conductor pattern provided between layers of the dielectric layers; and a plurality of via conductors extending through the dielectric layers. A plurality of LC resonators each including an inductor and a capacitor connected in parallel to each other are provided in the multilayer body, and the inductors in adjacent LC resonators are magnetically coupled to each other. The inductor in each LC resonator includes a loop inductor including the line conductor pattern and a pair of via conductors connected to both ends of the line conductor pattern, one via conductor of the loop inductor is connected to the capacitor conductor pattern, and the other via conductor of the loop inductor is connected to the ground conductor pattern. The capacitor in the LC resonator is defined by a capacitance between the capacitor conductor pattern and the ground conductor pattern. A magnetic coupling adjustment inductor is provided for at least one LC resonator, among the plurality of LC resonators. In the LC resonator for which the magnetic coupling adjustment inductor is provided, one end of the magnetic coupling adjustment inductor is connected to an intermediate point of the loop inductor and the other end of the magnetic coupling adjustment inductor is connected to the ground conductor pattern. The loop inductor and the magnetic coupling adjustment inductor in the LC resonator for which the magnetic coupling adjustment inductor is provided are magnetically coupled to the loop inductor in another adjacent LC resonator.

Preferably, the magnetic coupling adjustment inductor is defined by the line conductor pattern and the via conductor that are connected to each other and, in the LC resonator for which the magnetic coupling adjustment inductor is provided, the line conductor pattern of the magnetic coupling adjustment inductor is connected to an intermediate point of the via conductor at a side connected to the ground conductor pattern of the loop inductor and the via conductor of the magnetic coupling adjustment inductor is connected to the ground conductor pattern. In this case, since the winding direction of the loop inductor in the LC resonator for which the magnetic coupling adjustment inductor is provided is opposite to the winding direction of the magnetic coupling adjustment inductor, it is easy to adjust the strength of magnetic coupling between the inductors (the loop inductor and the magnetic coupling adjustment inductor) in the LC resonator for which the magnetic coupling adjustment inductor is provided and the inductor (the loop inductor) in another adjacent LC resonator.

The winding direction of the loop inductor in the LC resonator for which the magnetic coupling adjustment inductor is provided may be the same as that of the loop inductor in another adjacent LC resonator, and the via conductor of the magnetic coupling adjustment inductor in the LC resonator for which the magnetic coupling adjustment inductor is provided may be provided near the via conductor at a side connected to the capacitor conductor pattern of the loop inductor in another adjacent LC resonator. In this case, since the winding direction of the loop inductor in the LC resonator for which the magnetic coupling adjustment inductor is provided is the same as that of the loop inductor in another adjacent LC resonator, the loop inductor in the LC resonator for which the magnetic coupling adjustment inductor is provided is magnetically coupled to the loop inductor in the other adjacent LC resonator with a large strength. However, since the direction of the current flowing through the magnetic coupling adjustment inductor in the LC resonator for which the magnetic coupling adjustment inductor is provided is opposite to the direction of the current flowing through the loop inductor in the other adjacent LC resonator, the overall magnetic coupling between the inductors (the loop inductor and the magnetic coupling adjustment inductor) in the LC resonator for which the magnetic coupling adjustment inductor is provided and the inductor (the loop inductor) in the other adjacent LC resonator is adjusted so as to weaken or decrease its strength due to the magnetic coupling adjustment inductor.

Alternatively, the winding direction of the loop inductor in the LC resonator for which the magnetic coupling adjustment inductor is provided may be opposite to that of the loop inductor in another adjacent LC resonator, and the via conductor of the magnetic coupling adjustment inductor in the LC resonator for which the magnetic coupling adjustment inductor is provided may be provided near the via conductor at a side connected to the ground conductor pattern of the loop inductor in another adjacent LC resonator. In this case, since the winding direction of the loop inductor in the LC resonator for which the magnetic coupling adjustment inductor is provided is opposite to that of the loop inductor in another adjacent LC resonator, the loop inductor in the LC resonator for which the magnetic coupling adjustment inductor is provided is magnetically coupled to the loop inductor in the other adjacent LC resonator with low strength. However, since the direction of the current flowing through the magnetic coupling adjustment inductor in the LC resonator for which the magnetic coupling adjustment inductor is provided is the same as the direction of the current flowing through the loop inductor in the other adjacent LC resonator, the comprehensive magnetic coupling between the inductors (the loop inductor and the magnetic coupling adjustment inductor) in the LC resonator for which the magnetic coupling adjustment inductor is provided and the inductor (the loop inductor) in the other adjacent LC resonator is adjusted so as to strengthen or increase its strength due to the magnetic coupling adjustment inductor.

In multilayer LC filters according to preferred embodiments of the present invention, since the magnetic coupling adjustment inductor is provided for at least one LC resonator, among the plurality of LC resonators, it is possible to adjust the strength of the overall magnetic coupling between the inductors (the loop inductor and the magnetic coupling adjustment inductor) in the LC resonator for which the magnetic coupling adjustment inductor is provided and the inductor (the loop inductor) in another adjacent LC resonator with the magnetic coupling adjustment inductor without increasing the size of the multilayer body. Accordingly, the multilayer LC filters according to preferred embodiments of the present invention are each capable of achieving desired frequency characteristics without increasing the size of the multilayer body.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the drawings.

The respective preferred embodiments are only exemplary and the present invention is not limited to the preferred embodiments. In addition, the content described in different preferred embodiments may be combined and the content of the preferred embodiments in this case is included in the present invention. Furthermore, the drawings are provided to assist understanding of the preferred embodiments and may not necessarily be drawn strictly. For example, components that are drawn or the ratios between the dimensions of the components may not coincide with the ratios between the dimensions of the components described in the description. Furthermore, the components described in the description may be omitted in the drawings or a decreased number of components may be illustrated.

First Preferred Embodiment

Figure 1:
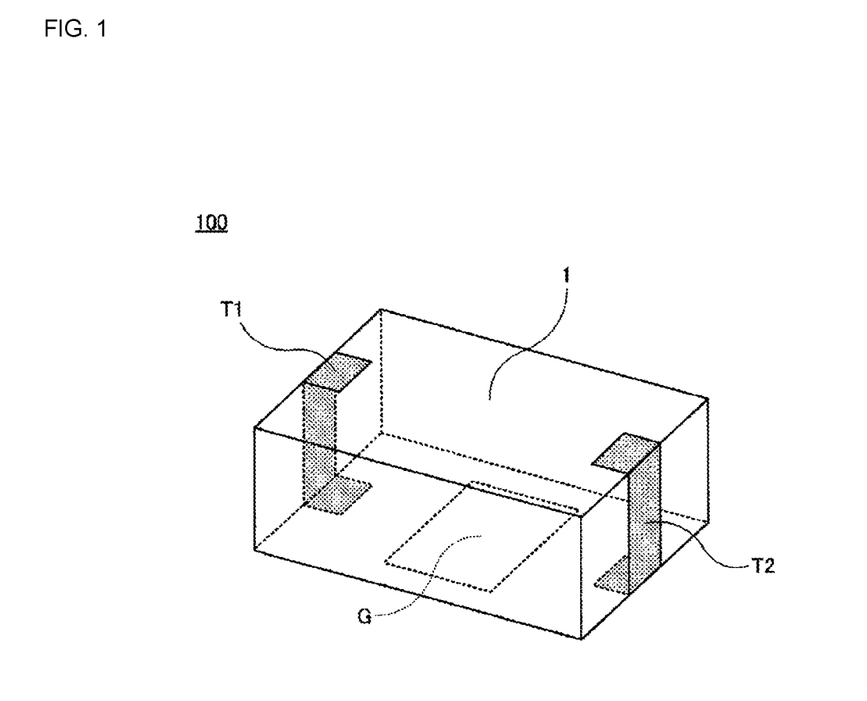
FIG. 1 is a perspective view illustrating a multilayer LC filter 100 according to a first preferred embodiment of the present invention.
Figure 2:
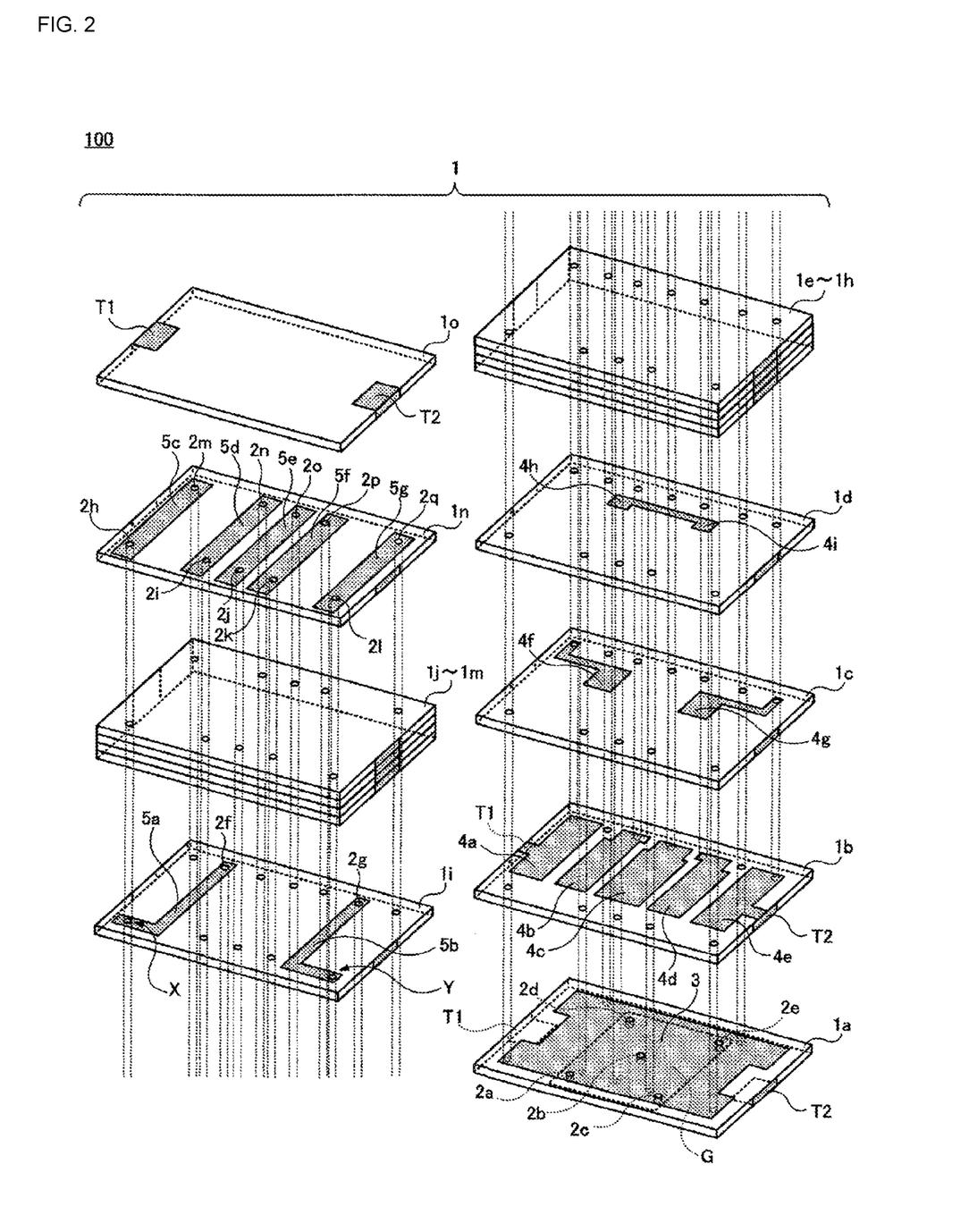
FIG. 2 is an exploded perspective view illustrating the multilayer LC filter 100.
Figure 3:
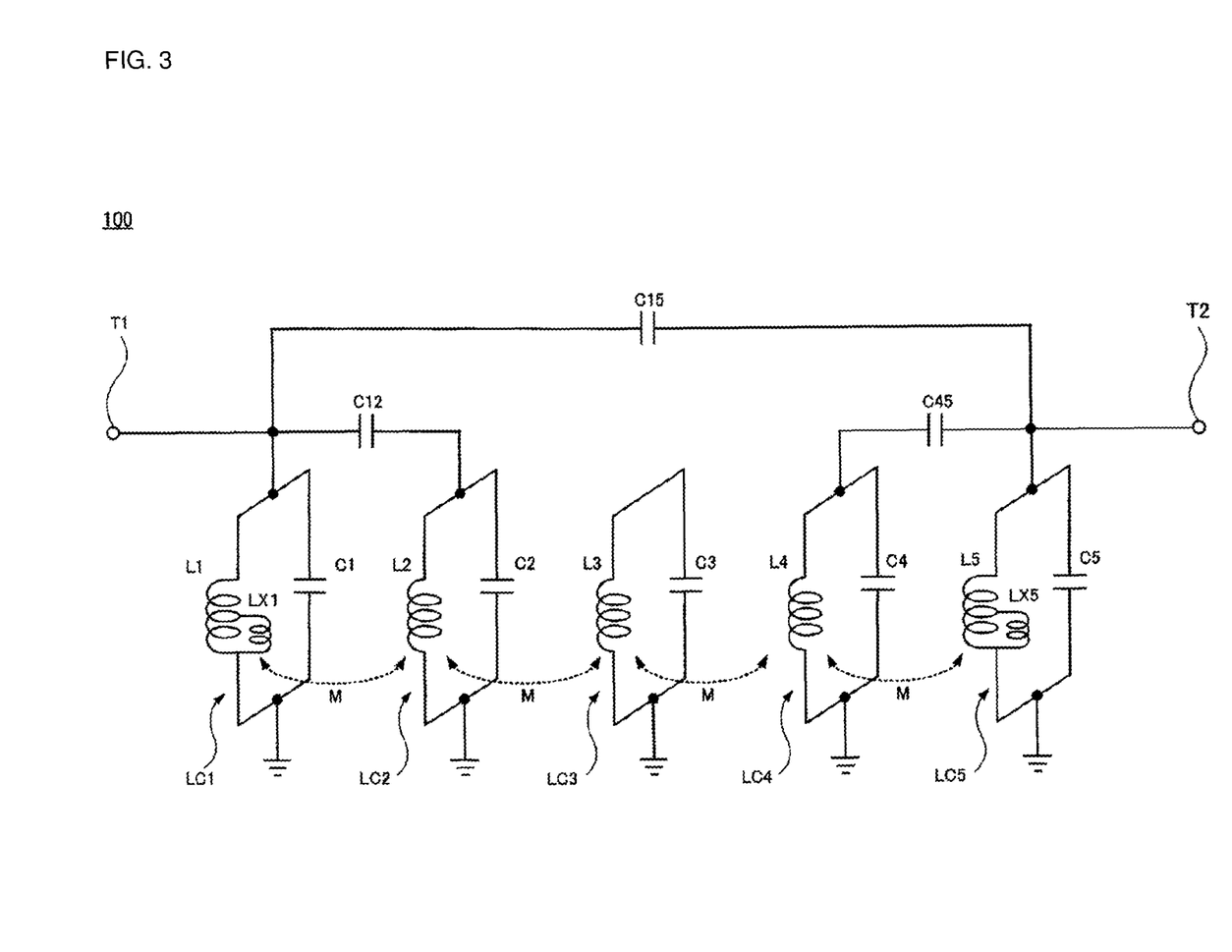
FIG. 3 is an equivalent circuit diagram of the multilayer LC filter 100.

FIG. 1 to FIG. 3 illustrate a multilayer LC filter 100 according to a first preferred embodiment of the present invention. FIG. 1 is a perspective view, FIG. 2 is an exploded perspective view, and FIG. 3 is an equivalent circuit diagram.

The multilayer LC filter 100 includes a multilayer body 1. A pair of input-output terminals T1 and T2 are provided on opposing end surfaces of the multilayer body 1. One end of each of the input-output terminals T1 and T2 extends to a lower main surface of the multilayer body 1 and the other end of each of the input-output terminals T1 and T2 extends to an upper main surface of the multilayer body 1. A ground terminal G is provided on the lower main surface of the multilayer body 1.

The multilayer body 1 includes fifteen dielectric layers 1a to 1o which are preferably made of, for example, ceramics and which are sequentially laminated from the bottom, as illustrated in FIG. 2.

The respective dielectric layers 1a to 1o of the multilayer body 1 will now be described.

The input-output terminals T1 and T2 are provided on opposing end surfaces of the dielectric layer 1a. Although the input-output terminals T1 and T2 are also provided on opposing end surfaces of the dielectric layers 1b to 1c described below, description of the input-output terminals T1 and T2 and the addition of the reference numerals and symbols to the drawings may be omitted if not required.

The ground terminal G is provided on the lower main surface of the dielectric layer 1a.

Five via conductors 2a to 2e extend through the upper main surface and the lower main surface of the dielectric layer 1a.

A ground conductor pattern 3 is provided on the upper main surface of the dielectric layer 1a. The ground conductor pattern 3 is connected to the ground terminal G with the via conductors 2a to 2e.

Seven via conductors 2f to 2l extend through the upper main surface and the lower main surface of the dielectric layer 1b. The via conductors 2f to 2l are illustrated to extend downward, compared with reality, in FIG. 2, which is an exploded perspective view, in order to clarify the connection relationship (the same applies to the via conductors described below). The respective via conductors 2f to 2l are connected to the ground conductor pattern 3.

Five capacitor conductor patterns 4a to 4e are provided on the upper main surface of the dielectric layer 1b. The capacitor conductor pattern 4a is connected to the input-output terminal T1. The capacitor conductor pattern 4e is connected to the input-output terminal T2.

The seven via conductors 2f to 2l extend through the upper main surface and the lower main surface of the dielectric layer 1c. Although the via conductors 2f to 2l also extend through the dielectric layer 1b, as described above, the via conductors having the same reference numeral and symbol, which extend through different dielectric layers, mean that the via conductors are connected to each other. In addition, five other via conductors 2m to 2q extend through the upper main surface and the lower main surface of the dielectric layer 1c. The via conductor 2m is connected to the capacitor conductor pattern 4a. The via conductor 2n is connected to the capacitor conductor pattern 4b. The via conductor 2o is connected to the capacitor conductor pattern 4c. The via conductor 2p is connected to the capacitor conductor pattern 4d. The via conductor 2q is connected to the capacitor conductor pattern 4e.

Two capacitor conductor patterns 4f and 4g are provided on the upper main surface of the dielectric layer 1c. The capacitor conductor pattern 4f is connected to the via conductor 2m. The capacitor conductor pattern 4g is connected to the via conductor 2q.

The twelve via conductors 2f to 2q extend through the upper main surface and the lower main surface of the dielectric layer 1d.

Two capacitor conductor patterns 4h and 4i are provided on the upper main surface of the dielectric layer 1d. The capacitor conductor pattern 4h and the capacitor conductor pattern 4i are connected to each other.

The twelve via conductors 2f to 2q extend through the upper main surfaces and the lower main surfaces of the four respective dielectric layers 1e to 1h.

The twelve via conductors 2f to 2q extend through the upper main surface and the lower main surface of the dielectric layer 1i.

Two line conductor patterns 5a and 5b are provided on the upper main surface of the dielectric layer 1i. One end of the line conductor pattern 5a is connected to an intermediate point X of the via conductor 2h and the other end thereof is connected to the via conductor 2f. One end of the line conductor pattern 5b is connected to an intermediate point Y of the via conductor 2l and the other end thereof is connected to the via conductor 2g.

The ten via conductors 2h to 2q extend through the upper main surfaces and the lower main surfaces of the four respective dielectric layers 1j to 1m.

The ten via conductors 2h to 2q extend through the upper main surface and the lower main surface of the dielectric layer 1n.

Five line conductor patterns 5c to 5g are provided on the upper main surface of the dielectric layer 1n so as to be spaced apart from each other and so as to be parallel or substantially parallel to each other. One end of the line conductor pattern 5c is connected to the via conductor 2h and the other end thereof is connected to the via conductor 2m. One end of the line conductor pattern 5d is connected to the via conductor 2i and the other end thereof is connected to the via conductor 2n. One end of the line conductor pattern 5e is connected to the via conductor 2j and the other end thereof is connected to the via conductor 2o. One end of the line conductor pattern 5f is connected to the via conductor 2k and the other end thereof is connected to the via conductor 2p. One end of the line conductor pattern 5g is connected to the via conductor 2l and the other end thereof is connected to the via conductor 2q.

The dielectric layer 1o is a protective layer. The input-output terminals T1 and T2 are provided on opposing end surfaces of the dielectric layer 1o.

The multilayer LC filter 100 having the above-described structure is capable of being manufactured using materials and manufacturing methods, which have heretofore been widely used in the multilayer LC filters.

The multilayer LC filter 100 has an equivalent circuit illustrated in FIG. 3.

The multilayer LC filter 100 includes the input-output terminal T1 and the input-output terminal T2.

The multilayer LC filter 100 includes five first to fifth LC resonators LC1 to LC5, which are sequentially arranged between the input-output terminal T1 and the input-output terminal T2. The input-output terminal T1 is connected to the first LC resonator LC1. The input-output terminal T2 is connected to the fifth LC resonator LC5.

The first LC resonator LC1 includes an inductor L1 and a capacitor C1, which are connected in parallel to each other. Similarly, the second LC resonator LC2 includes an inductor L2 and a capacitor C2, which are connected in parallel to each other. The third LC resonator LC3 includes an inductor L3 and a capacitor C3, which are connected in parallel to each other. The fourth LC resonator LC4 includes an inductor L4 and a capacitor C4, which are connected in parallel to each other. The fifth LC resonator LC5 includes an inductor L5 and a capacitor C5, which are connected in parallel to each other.

A magnetic coupling adjustment inductor LX1 is provided in the first LC resonator LC1. A portion of the magnetic coupling adjustment inductor LX1 is connected in parallel to the inductor L1. In other words, the magnetic coupling adjustment inductor LX1 is connected between an intermediate point of the inductor L1 and ground.

A magnetic coupling adjustment inductor LX5 is provided in the fifth LC resonator LC5. A portion of the magnetic coupling adjustment inductor LX5 is connected in parallel to the inductor L5. In other words, the magnetic coupling adjustment inductor LX5 is connected between an intermediate point of the inductor L5 and the ground.

The inductor L1 and the magnetic coupling adjustment inductor LX1 in the first LC resonator LC1 are magnetically coupled to the inductor L2 in the second LC resonator LC2. The inductor L2 in the second LC resonator LC2 is magnetically coupled to the inductor L3 in the third LC resonator LC3. The inductor L3 in the third LC resonator LC3 is magnetically coupled to the inductor L4 in the fourth LC resonator LC4. The inductor L4 in the fourth LC resonator LC4 is magnetically coupled to the inductor L5 and the magnetic coupling adjustment inductor LX5 in the fifth LC resonator LC5.

The first LC resonator LC1 is capacitively coupled to the second LC resonator LC2 with a capacitor C12. The fourth LC resonator LC4 is capacitively coupled to the fifth LC resonator LC5 with a capacitor C45. The first LC resonator LC1 is capacitively coupled to the fifth LC resonator LC5 with a capacitor C15.

The multilayer LC filter 100 having the equivalent circuit described above defines a five-stage band pass filter having desired frequency characteristics with the five LC resonators provided between the input-output terminal T1 and the input-output terminal T2.

Next, the relationship between the equivalent circuit of the multilayer LC filter 100 and the structure thereof will now be described.

The inductor L1 in the first LC resonator LC1 includes a loop inductor in which the via conductor 2m, the line conductor pattern 5c, and the via conductor 2h are connected to each other. The via conductor 2m is connected to the capacitor conductor pattern 4a and the via conductor 2h is connected to the ground conductor pattern 3. The capacitor C1 in the first LC resonator LC1 is defined by a capacitance between the capacitor conductor pattern 4a and the ground conductor pattern 3. The capacitor conductor pattern 4a is connected to the input-output terminal T1, as described above.

The magnetic coupling adjustment inductor LX1 in the first LC resonator LC1 includes the line conductor pattern 5a and the via conductor 2f, which are connected in series to each other. The line conductor pattern 5a of the magnetic coupling adjustment inductor LX1 is connected to the intermediate point X of the via conductor 2h, and the via conductor 2f is connected to the ground conductor pattern 3.

The via conductor 2f of the magnetic coupling adjustment inductor LX1 in the first LC resonator LC1 is provided near the via conductor 2n of the inductor L2 in the second LC resonator LC2 described below. As a result, the line conductor pattern 5a of the magnetic coupling adjustment inductor LX1 and the line conductor pattern 5d of the inductor L2 in the second LC resonator LC2 are parallel or substantially parallel to each other. However, it is not necessary to arrange the line conductor pattern 5a and the line conductor pattern 5d so as to be strictly parallel to each other. The line conductor pattern 5a and the line conductor pattern 5d may be arranged in a slightly tilted configuration.

Adjusting the angle between the line conductor pattern 5a and the line conductor pattern 5d enables the strength of the magnetic coupling between the line conductor pattern 5a and the line conductor pattern 5d to be adjusted.

The inductor L2 in the second LC resonator LC2 includes a loop inductor in which the via conductor 2n, the line conductor pattern 5d, and the via conductor 2i are connected to each other. The via conductor 2n is connected to the capacitor conductor pattern 4b and the via conductor 2i is connected to the ground conductor pattern 3. The capacitor C2 in the second LC resonator LC2 is defined by a capacitance between the capacitor conductor pattern 4b and the ground conductor pattern 3.

The inductor L3 in the third LC resonator LC3 includes a loop inductor in which the via conductor 2o, the line conductor pattern 5e, and the via conductor 2j are connected to each other. The via conductor 2o is connected to the capacitor conductor pattern 4c and the via conductor 2j is connected to the ground conductor pattern 3. The capacitor C3 in the third LC resonator LC3 is defined by a capacitance between the capacitor conductor pattern 4c and the ground conductor pattern 3.

The inductor L4 in the fourth LC resonator LC4 includes a loop inductor in which the via conductor 2p, the line conductor pattern 5f, and the via conductor 2k are connected to each other. The via conductor 2p is connected to the capacitor conductor pattern 4d and the via conductor 2k is connected to the ground conductor pattern 3. The capacitor C4 in the fourth LC resonator LC4 is defined by a capacitance between the capacitor conductor pattern 4d and the ground conductor pattern 3.

The inductor L5 in the fifth LC resonator LC5 includes a loop inductor in which the via conductor 2q, the line conductor pattern 5g, and the via conductor 2l are connected to each other. The via conductor 2q is connected to the capacitor conductor pattern 4e and the via conductor 2l is connected to the ground conductor pattern 3. The capacitor C5 in the fifth LC resonator LC5 is defined by a capacitance between the capacitor conductor pattern 4e and the ground conductor pattern 3. The capacitor conductor pattern 4e is connected to the input-output terminal T2, as described above.

The magnetic coupling adjustment inductor LX5 in the fifth LC resonator LC5 includes the line conductor pattern 5b and the via conductor 2g, which are connected in series to each other. The line conductor pattern 5b of the magnetic coupling adjustment inductor LX5 is connected to the intermediate point Y of the via conductor 2l, and the via conductor 2g is connected to the ground conductor pattern 3.

The via conductor 2g of the magnetic coupling adjustment inductor LX5 in the fifth LC resonator LC5 is provided near the via conductor 2p of the inductor L4 in the fourth LC resonator LC4. As a result, the line conductor pattern 5b of the magnetic coupling adjustment inductor LX5 and the line conductor pattern 5f of the inductor L4 in the fourth LC resonator LC4 are arranged so as to be parallel or substantially parallel to each other. However, it is not necessary to arrange the line conductor pattern 5b and the line conductor pattern 5f so as to be strictly parallel to each other. The line conductor pattern 5b and the line conductor pattern 5f may be arranged in a slightly tilted configuration. Adjusting the angle between the line conductor pattern 5b and the line conductor pattern 5f enables the strength of the magnetic coupling between the line conductor pattern 5b and the line conductor pattern 5f to be adjusted.

The capacitor C12 is defined by a capacitance between the capacitor conductor pattern 4f and the capacitor conductor pattern 4b. As described above, the capacitor conductor pattern 4f is connected to the via conductor 2m. The capacitor conductor pattern 4b is also a capacitor conductor pattern of the capacitor C2 in the second LC resonator LC2.

The capacitor C15 is defined by a capacitance between the capacitor conductor pattern 4f and the capacitor conductor pattern 4h and a capacitance between the capacitor conductor pattern 4i and the capacitor conductor pattern 4g. As described above, the capacitor conductor pattern 4f is connected to the via conductor 2m, the capacitor conductor pattern 4h and the capacitor conductor pattern 4i are connected to each other, and the capacitor conductor pattern 4g is connected to the via conductor 2q.

The capacitor C45 is defined by a capacitance between the capacitor conductor pattern 4g and the capacitor conductor pattern 4d. As described above, the capacitor conductor pattern 4g is connected to the via conductor 2q. The capacitor conductor pattern 4d is also a capacitor conductor pattern of the capacitor C4 in the fourth LC resonator LC4.

With the above-described relationship, in the multilayer LC filter 100, the equivalent circuit illustrated in FIG. 3 is provided in the multilayer body 1.

In the multilayer LC filter 100, the loop inductors including the inductors L1 to L5 in the first to fifth LC resonators LC1 to LC5, respectively, have the same winding direction. In other words, in a perspective view of the multilayer body 1 from the end surface side at which the input-output terminal T1 is provided to the end surface side at which the input-output terminal T2 is provided, the loop inductor in which the via conductor 2m, the line conductor pattern 5c, and the via conductor 2h, which define the inductor L1, are connected to each other, the loop inductor in which the via conductor 2n, the line conductor pattern 5d, and the via conductor 2i, which define the inductor L2, are connected to each other, the loop inductor in which the via conductor 2o, the line conductor pattern 5e, and the via conductor 2j, which define the inductor L3, are connected to each other, the loop inductor in which the via conductor 2p, the line conductor pattern 5f, and the via conductor 2k, which define the inductor L4, are connected to each other, and the loop inductor in which the via conductor 2q, the line conductor pattern 5g, and the via conductor 2l, which define the inductor L5, are connected to each other are wound in the same direction.

Since all of the loop inductors have the same winding direction in the multilayer LC filter 100, adjacent inductors, among the inductors L1 to L5 in the first to fifth LC resonators LC1 to LC5, respectively, are magnetically coupled to each other with a large strength.

For example, the loop inductor of the inductor L1 in the first LC resonator LC1 and the loop inductor of the inductor L2 in the second LC resonator LC2 have the same winding direction and are magnetically coupled to each other with a large strength. However, the first LC resonator LC1 includes the magnetic coupling adjustment inductor LX1 and the magnetic coupling adjustment inductor LX1 weakens or decreases the magnetic coupling of the large strength by a certain amount. In other words, since the current flows through the magnetic coupling adjustment inductor LX1 in a direction opposite to the direction of the current flowing through the inductor L2 in the second LC resonator LC2, the magnetic coupling adjustment inductor LX1 weakens or decreases the strength of the overall magnetic coupling between the inductors (the inductor L1 and the magnetic coupling adjustment inductor LX1) in the first LC resonator LC1 and the inductor (the inductor L2) in the second LC resonator LC2.

Similarly, the loop inductor of the inductor L4 in the fourth LC resonator LC4 and the loop inductor of the inductor L5 in the fifth LC resonator LC5 have the same winding direction and are magnetically coupled to each other with a large strength. However, the fifth LC resonator LC5 includes the magnetic coupling adjustment inductor LX5 and the magnetic coupling adjustment inductor LX5 weakens or decreases the magnetic coupling of the large strength by a certain amount. In other words, since the current flows through the magnetic coupling adjustment inductor LX5 in a direction opposite to the direction of the current flowing through the inductor L4 in the fourth LC resonator LC4, the magnetic coupling adjustment inductor LX5 weakens or decreases the strength of the overall magnetic coupling between the inductor (the inductor L4) in the fourth LC resonator LC4 and the inductors (the inductor L5 and the magnetic coupling adjustment inductor LX5) in the fifth LC resonator LC5.

The multilayer LC filter 100 adjusts the strength of the magnetic coupling between the inductors in adjacent LC resonators not by adjusting the distance between the inductor L1 and the inductor L2 and the distance between the inductor L4 and the inductor L5 but by providing the magnetic coupling adjustment inductors LX1 and LX5. Accordingly, with the multilayer LC filter 100, it is possible to adjust the magnetic coupling between the inductors in adjacent LC resonators to achieve desired frequency characteristics without increasing the size.

Figure 4:
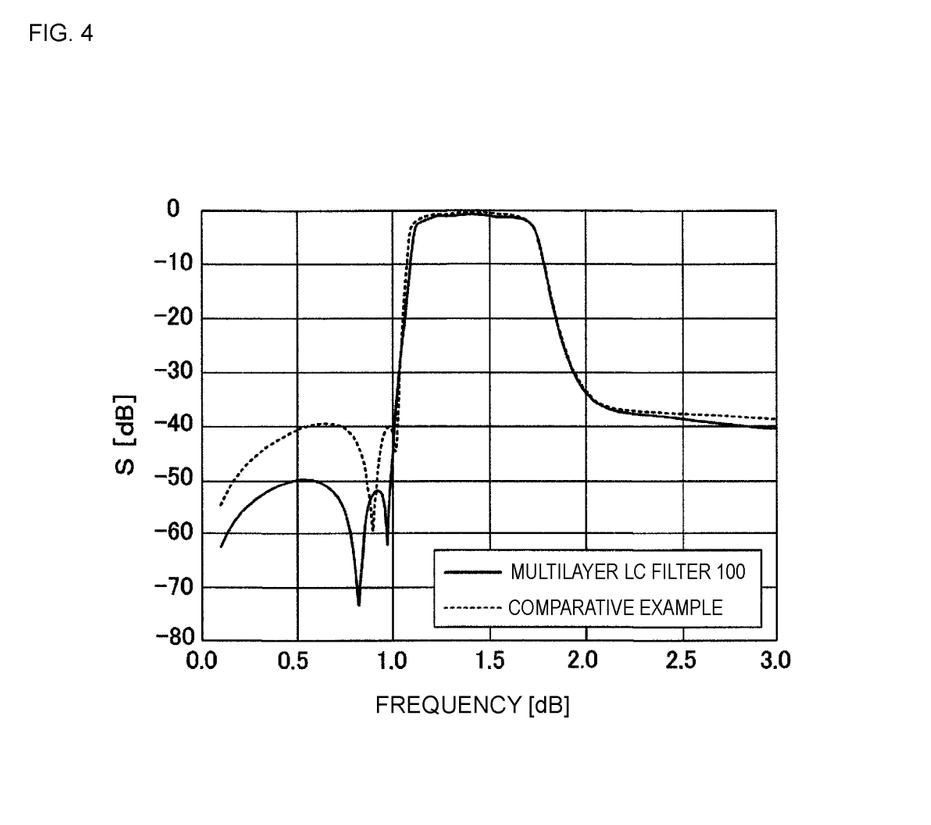
FIG. 4 is a graph indicating frequency characteristics of the multilayer LC filter 100 and frequency characteristics of a multilayer LC filter according to a comparative example.

FIG. 4 illustrates frequency characteristics of the multilayer LC filter 100. In addition, frequency characteristics of a multilayer LC filter according to a comparative example are also illustrated in FIG. 4 for comparison. In the multilayer LC filter according to the comparative example, the magnetic coupling adjustment inductor LX1 (the line conductor pattern 5a and the via conductor 2f) and the magnetic coupling adjustment inductor LX5 (the line conductor pattern 5b and the via conductor 2g) are removed from the multilayer LC filter 100.

FIG. 4 indicates that the attenuation of the multilayer LC filter 100 is greater than that of the multilayer LC filter of the comparative example at both the low frequency side and the high frequency side outside the pass band and the multilayer LC filter 100 has excellent frequency characteristics.

Second Preferred Embodiment

Figure 5:
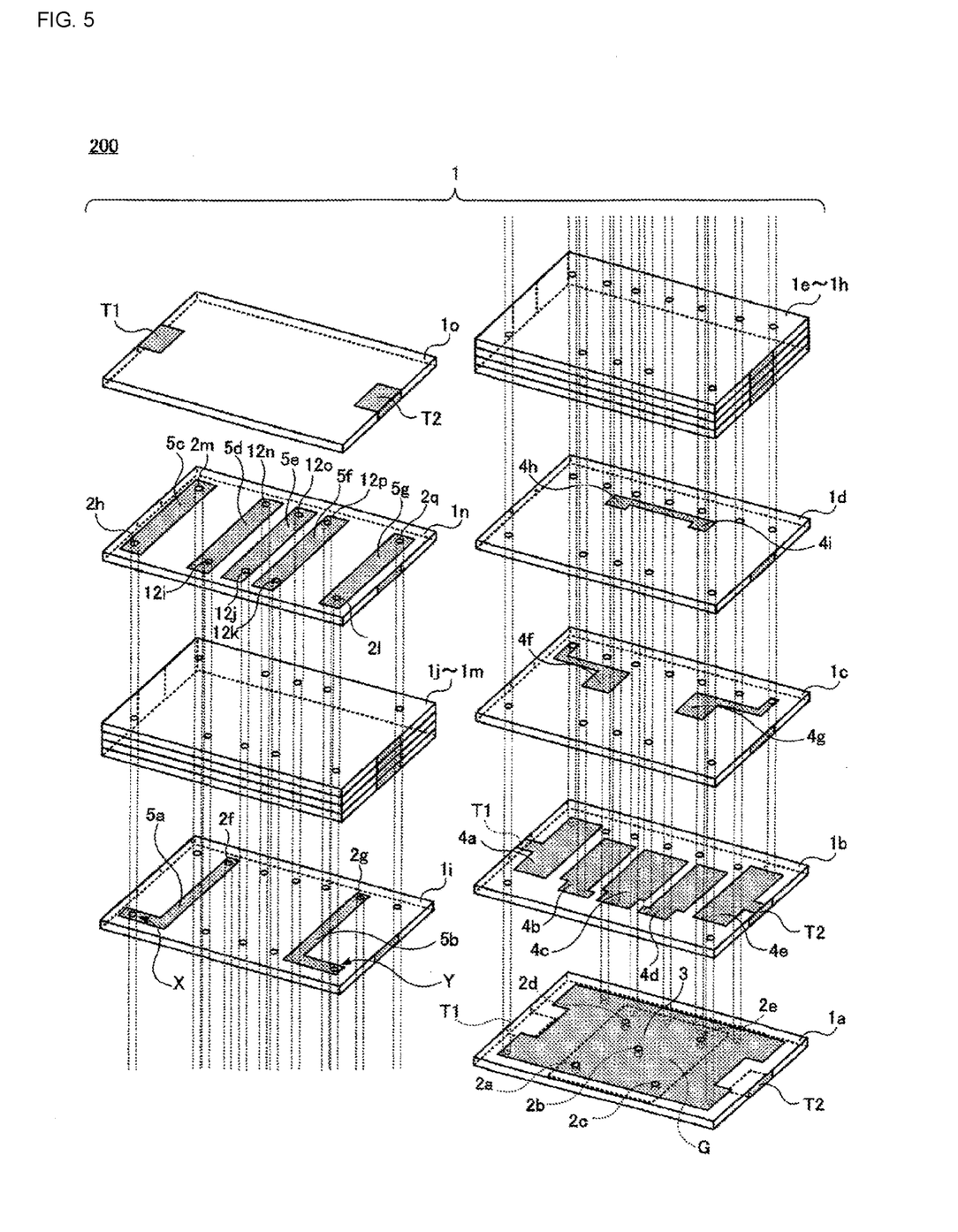
FIG. 5 is an exploded perspective view illustrating a multilayer LC filter 200 according to a second preferred embodiment of the present invention.

FIG. 5 illustrates a multilayer LC filter 200 according to a second preferred embodiment of the present invention. FIG. 5 is an exploded perspective view of the multilayer LC filter 200.

The multilayer LC filter 200 results from modification of a portion of the configuration of the multilayer LC filter 100 according to the first preferred embodiment. Specifically, in the multilayer LC filter 100, the loop inductors of the inductors L1 to L5 in the first to fifth LC resonators LC1 to LC5, respectively, have the same winding direction. In contrast, in the multilayer LC filter 200, the winding direction of the loop inductors of the inductors L2 to L3 in the second to third LC resonators LC2 to LC3 is opposite to that in the multilayer LC filter 100.

More specifically, although the via conductor 2n of the inductor L2 is connected to the capacitor conductor pattern 4b and the via conductor 2i of the inductor L2 is connected to the ground conductor pattern 3 in the multilayer LC filter 100, modifications are made to the configuration of the multilayer LC filter 100 in the multilayer LC filter 200. A via conductor 12n provided at the same position as that of the via conductor 2n is connected to the ground conductor pattern 3, and a via conductor 12i provided at the same position as that of the via conductor 2i is connected to the capacitor conductor pattern 4b. Similarly, although the via conductor 2o of the inductor L3 is connected to the capacitor conductor pattern 4c and the via conductor 2j of the inductor L3 is connected to the ground conductor pattern 3 in the multilayer LC filter 100, modifications are made to the configuration of the multilayer LC filter 100 in the multilayer LC filter 200. A via conductor 12o provided at the same position as that of the via conductor 2o is connected to the ground conductor pattern 3, and a via conductor 12j provided at the same position as that of the via conductor 2j is connected to the capacitor conductor pattern 4c. Similarly, although the via conductor 2p of the inductor L4 is connected to the capacitor conductor pattern 4d and the via conductor 2k of the inductor L4 is connected to the ground conductor pattern 3 in the multilayer LC filter 100, modifications are made to the configuration of the multilayer LC filter 100 in the multilayer LC filter 200. A via conductor 12p provided at the same position as that of the via conductor 2p is connected to the ground conductor pattern 3, and a via conductor 12k provided at the same position as that of the via conductor 2k is connected to the capacitor conductor pattern 4d.

In the multilayer LC filter 200, the shapes of the capacitor conductor patterns 4b, 4c, and 4d are slightly modified in conjunction with the modification of the connection relationship. However, the reference numerals and symbols indicating the capacitor conductor patterns 4b, 4c, and 4d are not changed for easy understanding.

In the multilayer LC filter 200, the winding direction of the loop inductor of the inductor L1 in the first LC resonator LC1 is opposite to that of the loop inductor of the inductor L2 in the second LC resonator LC2, and the loop inductor of the inductor L1 in the first LC resonator LC1 is magnetically coupled to the loop inductor of the inductor L2 in the second LC resonator LC2 with a small strength. However, the first LC resonator LC1 includes the magnetic coupling adjustment inductor LX1 in the multilayer LC filter 200 and the current flows through the magnetic coupling adjustment inductor LX1 in the same direction as that of the current flowing through the inductor L2 in the second LC resonator LC2. Accordingly, the magnetic coupling adjustment inductor LX1 strengthens or increases the strength of the overall magnetic coupling between the inductors (the inductor L1 and the magnetic coupling adjustment inductor LX1) in the first LC resonator LC1 and the inductor (the inductor L2) in the second LC resonator LC2.

Similarly, in the multilayer LC filter 200, the winding direction of the loop inductor of the inductor L4 in the fourth LC resonator LC4 is opposite to that of the loop inductor of the inductor L5 in the fifth LC resonator LC5, and the loop inductor of the inductor L4 in the fourth LC resonator LC4 is magnetically coupled to the loop inductor of the inductor L5 in the fifth LC resonator LC5 with a small strength. However, the fifth LC resonator LC5 includes the magnetic coupling adjustment inductor LX5 in the multilayer LC filter 200 and the current flows through the magnetic coupling adjustment inductor LX5 in the same direction as that of the current flowing through the inductor L4 in the fourth LC resonator LC4. Accordingly, the magnetic coupling adjustment inductor LX5 strengthens or increases the strength of the overall magnetic coupling between the inductor (the inductor L4) in the fourth LC resonator LC4 and the inductors (the inductor L5 and the magnetic coupling adjustment inductor LX5) in the fifth LC resonator LC5.

Also with the multilayer LC filter 200 according to the second preferred embodiment, as in the multilayer LC filter 100 according to the first preferred embodiment, it is possible to adjust the magnetic coupling between the inductors in adjacent LC resonators to achieve desired frequency characteristics without increasing the size of the multilayer body 1.

The multilayer LC filter 100 according to the first preferred embodiment and the multilayer LC filter 200 according to the second preferred embodiment are described above. However, the present invention is not limited to the first and second preferred embodiments and various modifications may be made without departing from the sprit and scope of the present invention.

For example, although the five-stage band pass filters including the five LC resonators are provided in the multilayer LC filters 100 and 200, the kind of the filters and the number of stages of the filters are arbitrary and are not limited to the content described above.

In addition, the magnetic coupling adjustment inductor LX1 is provided in the first LC resonator LC1 and the magnetic coupling adjustment inductor LX5 is provided in the fifth LC resonator LC5 in both of the multilayer LC filters 100 and 200. However, the number of magnetic coupling adjustment inductors and the LC resonator for which the magnetic coupling adjustment inductor is provided are arbitrary and are not limited to the configuration described above. For example, the magnetic coupling adjustment inductors may be provided for both of two adjacent LC resonators. Alternatively, one magnetic coupling adjustment inductor may be provided or three or more magnetic coupling adjustment inductors may be provided in the multilayer body 1.

Furthermore, although the magnetic coupling adjustment inductor LX1 is connected between the via conductor 2h of the loop inductor of the first LC resonator LC1 and the ground conductor pattern 3 in the multilayer LC filters 100 and 200, the portion at which the magnetic coupling adjustment inductor LX1 is connected is not limited thereto. For example, the magnetic coupling adjustment inductor LX1 may be connected between the via conductor 2m of the loop inductor in the first LC resonator LC1 and the ground conductor pattern 3 or between the line conductor pattern 5c of the first LC resonator LC1 and the ground conductor pattern 3. Similarly, although the magnetic coupling adjustment inductor LX5 is connected between the via conductor 2l of the loop inductor of the fifth LC resonator LC5 and the ground conductor pattern 3 in the multilayer LC filters 100 and 200, the portion at which the magnetic coupling adjustment inductor LX5 is connected is not limited thereto. For example, the magnetic coupling adjustment inductor LX5 may be connected between the via conductor 2q of the loop inductor in the fifth LC resonator LC5 and the ground conductor pattern 3 or between the line conductor pattern 5g of the fifth LC resonator LC5 and the ground conductor pattern 3.

Furthermore, although the multilayer body 1 includes the fifteen dielectric layers $a$ to $1o$ made of ceramics in the multilayer LC filters 100 and 200, the material and the number of dielectric layers are arbitrary and are not limited thereto. For example, the dielectric layers 1a to 1o may be made of resin.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer LC filter comprising:
a rectangular or substantially rectangular parallelepiped multilayer body including a plurality of dielectric layers laminated therein;
a plurality of line conductor patterns between layers of the plurality of dielectric layers;
a plurality of capacitor conductor patterns between layers of the plurality of dielectric layers;
at least one ground conductor pattern between layers of the plurality of dielectric layers; and
a plurality of via conductors extending through the plurality of dielectric layers; wherein
a plurality of LC resonators each including an inductor and a capacitor connected in parallel to each other are provided in the multilayer body and the inductors in adjacent LC resonators of the plurality of LC resonators are magnetically coupled to each other;
the inductor in each of the plurality of LC resonators includes: a loop inductor including one of the plurality of line conductor patterns and a pair of the plurality of via conductors connected to two ends of the one line conductor pattern, one of the pair of via conductors of the loop inductor is connected to one of the plurality of capacitor conductor patterns, and another one of the pair of via conductors of the loop inductor is connected to the at least one ground conductor pattern;
the capacitor in each of the plurality of LC resonators is defined by a capacitance between the corresponding one of the plurality of capacitor conductor patterns and the at least one ground conductor pattern;
a magnetic coupling adjustment inductor is provided for at least one LC resonator of the plurality of LC resonators;
in the at least one LC resonator for which the magnetic coupling adjustment inductor is provided, one end of the magnetic coupling adjustment inductor is connected to an intermediate point of the loop inductor and the other end of the magnetic coupling adjustment inductor is connected to the at least one ground conductor pattern; and
the loop inductor and the magnetic coupling adjustment inductor in the at least one LC resonator for which the magnetic coupling adjustment inductor is provided are magnetically coupled to the loop inductor in another adjacent LC resonator of the plurality of LC resonators.

2. The multilayer LC filter according to claim 1, wherein
the magnetic coupling adjustment inductor includes one of the plurality of line conductor patterns and one of the pair of via conductors that are connected to each other; and
in the at least one LC resonator for which the magnetic coupling adjustment inductor is provided, the line conductor pattern of the magnetic coupling adjustment inductor is connected to an intermediate point of the one of the pair of via conductors at a side connected to the at least one ground conductor pattern of the loop inductor and the one of the pair of via conductors of the magnetic coupling adjustment inductor is connected to the at least one ground conductor pattern.

3. The multilayer LC filter according to claim 2, wherein
a winding direction of the loop inductor in the at least one LC resonator for which the magnetic coupling adjustment inductor is provided is the same as that of the loop inductor in another adjacent LC resonator of the plurality of LC resonators; and the via conductor of the magnetic coupling adjustment inductor in the at least one LC resonator for which the magnetic coupling adjustment inductor is provided is near the via conductor at a side connected to the capacitor conductor pattern of the loop inductor in the another adjacent LC resonator.

4. The multilayer LC filter according to claim 2, wherein
a winding direction of the loop inductor in the at least one LC resonator for which the magnetic coupling adjustment inductor is provided is opposite to that of the loop inductor in another adjacent LC resonator of the plurality of LC resonators; and the via conductor of the magnetic coupling adjustment inductor in the at least one LC resonator for which the magnetic coupling adjustment inductor is provided is near the via conductor at a side connected to the at least one ground conductor pattern of the loop inductor in the another adjacent LC resonator.

5. The multilayer LC filter according to claim 1, wherein
a winding direction of the loop inductor in the at least one LC resonator for which the magnetic coupling adjustment inductor is provided is the same as that of the loop inductor in another adjacent LC resonator of the plurality of LC resonators; and a via conductor of the magnetic coupling adjustment inductor in the at least one LC resonator for which the magnetic coupling adjustment inductor is provided is near the via conductor at a side connected to the capacitor conductor pattern of the loop inductor in the another adjacent LC resonator.

6. The multilayer LC filter according to claim 1, wherein
a winding direction of the loop inductor in the at least one LC resonator for which the magnetic coupling adjustment inductor is provided is opposite to that of the loop inductor in another adjacent LC resonator of the plurality of LC resonators; and a via conductor of the magnetic coupling adjustment inductor in the at least one LC resonator for which the magnetic coupling adjustment inductor is provided is near the via conductor at a side connected to the at least one ground conductor pattern of the loop inductor in the another adjacent LC resonator.

* * * * *